United States Patent
Fabiszewski

(10) Patent No.: US 12,483,017 B2
(45) Date of Patent: Nov. 25, 2025

(54) ELECTRICAL OUTLET COVER

(71) Applicant: Grease Armor USA, Inc., Cambridge, MD (US)

(72) Inventor: James Fabiszewski, Cambridge, MD (US)

(73) Assignee: Grease Armor USA, Inc., Cambridge, MD (US)

( * ) Notice: Subject to any disclaimer, the term of this patent is extended or adjusted under 35 U.S.C. 154(b) by 0 days.

(21) Appl. No.: 18/382,170

(22) Filed: Oct. 20, 2023

(65) Prior Publication Data

US 2024/0421573 A1 Dec. 19, 2024

Related U.S. Application Data

(63) Continuation of application No. 18/209,832, filed on Jun. 14, 2023, now Pat. No. 11,811,208.

(51) Int. Cl.
  *H02G 3/14* (2006.01)
  *H01R 13/447* (2006.01)
  *H05K 5/02* (2006.01)

(52) U.S. Cl.
  CPC ............ *H02G 3/14* (2013.01); *H01R 13/447* (2013.01); *H05K 5/0247* (2013.01)

(58) Field of Classification Search
  CPC ............ H02G 3/14; H02G 3/08; H02G 3/081; H02G 3/085; H01R 13/447; H01R 13/453; H01R 13/46; H01R 13/52; H01R 13/53; H05K 5/0247; H05K 5/0217; H05K 5/00; H05K 5/02; H05K 5/03

USPC .................. 174/66, 67, 50, 53, 57, 58, 488; 220/241, 242, 3.2–3.9, 4.02; 439/135, 439/147, 373
  See application file for complete search history.

(56) References Cited

U.S. PATENT DOCUMENTS

| | | |
|---|---|---|
| 2,510,745 A | 6/1950 | Kilgore |
| 3,491,327 A | 1/1970 | Thomas et al. |
| 5,243,135 A | 9/1993 | Shotey |
| 6,133,531 A | 10/2000 | Hayduke et al. |
| 6,457,843 B1 | 10/2002 | Kester et al. |
| 7,105,745 B2 | 9/2006 | Drane et al. |
| 7,164,083 B1 | 1/2007 | Carroll |
| 7,179,996 B1 | 2/2007 | Britt et al. |
| 7,431,594 B2 | 10/2008 | Castaldo et al. |
| 8,110,743 B2 | 2/2012 | Drane |

(Continued)

*Primary Examiner* — Angel R Estrada
(74) *Attorney, Agent, or Firm* — HEA Law PLLC; Darrin A. Auito

(57) ABSTRACT

An outlet cover designed to prevent airborne contaminants from entering electrical outlets. The outlet cover is formed with an upper section that includes a lip portion and a top portion, a front section attached to the top portion of the upper section, a right-side section attached to the front section and the upper section, and a left-side section attached to the front section and the upper section. The lip portion extends downward and is positioned generally parallel to the front section. The right-side section is planar shaped comprising right-side bottom side, right-side front side, right-side back side, and right-side top side. Likewise, the left-side section is planar shaped comprising left-side bottom side, left-side front side, left-side back side, and left-side top side. The top portion of the upper section slants downward and towards the front section of the outlet cover.

19 Claims, 4 Drawing Sheets

(56) References Cited

U.S. PATENT DOCUMENTS

| | | |
|---|---|---|
| 8,586,864 B1 | 11/2013 | Shotey et al. |
| 9,680,292 B2 | 6/2017 | Wijaya et al. |
| 11,811,208 B1 * | 11/2023 | Fabiszewski ............ H02G 3/14 |

* cited by examiner

ELECTRICAL OUTLET COVER

CROSS-REFERENCE TO RELATED APPLICATION

This application is a continuation of pending U.S. application Ser. No. 18/209,832, filed on Jun. 14, 2023, the entire disclosures of which are incorporated herein by reference.

TECHNICAL FIELD

The present disclosure relates to the field of safety covers for electrical outlets and, more specifically, to an outlet cover for electrical outlets located near grease splatter source in commercial kitchens.

BACKGROUND

Grease (food) production in commercial kitchens, which happens with any cooking operation involving fats or oils, creates multiple safety problems, productivity concerns, and equipment failure, as the air-borne grease contaminants are released into the work environment.

The outlet cover assembly of the present disclosure (e.g., solid stainless-steel) is designed to improve safety and reduce the risk of failed equipment resulting in loss of revenue as well as the coordination and expenses of scheduling service technicians and paying for unnecessary repairs. Specifically, when installed, the outlet cover protects both the point of electrical connection and electrical disconnection of kitchen equipment from grease contamination and deterioration, therefore reducing the risk of flash grease fire, electrical shock, and personal injury associated with grease build-up, and eliminates the disturbances to business and loss of revenue from inoperative kitchen equipment. It also protects both the point of electrical connection and electrical disconnection of kitchen equipment from water and/or chemicals (e.g., degreasers) used in the kitchen cleaning process, e.g., which might be sprayed throughout the kitchen with a power washer for periodic/nightly cleaning process.

There is no product on the market that is available to solve the grease contamination and deteriorations' issue. By designing, for example, a 100% solid stainless-steel cover that matches commercial kitchen stainless-steel standards in material, thickness and strength, protectiveness and cleanability it is the ideal design and fit to increase safety and protect the equipment from grease contamination that will result in equipment failure.

The design of the seamless tight fit of the 100% solid stainless-steel cover to the existing commercial kitchen industry standard stainless-steel walls eliminates any possibility of grease contamination that will lead to deterioration and electrical connect, disconnect and equipment failure and it creates a level of protection to the employee who is cleaning the work areas in these commercial kitchens from coming in contact with the electrical device that the cover is protecting.

SUMMARY

According to one embodiment, an outlet cover includes upper section comprising a lip portion and a top portion, a front section attached to the top portion of the upper section, a right-side section attached to the front section and the upper section, and a left-side section attached to the front section and the upper section. The lip portion extends downward and is positioned generally parallel to the front section. The right-side section is planar shaped comprising right-side bottom side, right-side front side, right-side back side, and right-side top side. Likewise, the left-side section is planar shaped comprising left-side bottom side, left-side front side, left-side back side, and left-side top side. Further, an open end opposite the front section is defined by the lip portion, the right-side back side and the left-side back side. The top portion of the upper section slants downward and away from the open end of the outlet cover and towards the front section of the outlet cover.

The outlet cover may also include a bottom section attached to the front section, the right-side section, and the left-side section, wherein the open end is further defined by the bottom section. An opening configured to allow passage of an electrical cord inside the outlet cover may be formed in the bottom section.

In another embodiment, for example, the bottom section may include bottom left section and bottom right section, the bottom left-section attached to the front section and the left-side section, and the bottom right-section attached to the front section and the right-side section. The bottom left section separated from the bottom right section to form a gap therebetween, the gap configured to allow passage of an electrical cord inside said outlet cover, and the open end of said outlet cover is further defined by the bottom left section and the bottom right section.

The outlet cover is configured to cooperate with a bracket that is attached to a wall surface, e.g., adjacent to an electrical outlet desired to be covered. The bracket may include an offset portion extending across lengthwise direction of the hanging bracket designed to accommodate receipt of the lip portion of the outlet cover to thereby allow the outlet cover to securely and removably attach to the bracket.

The features and advantages described above, as well as others, will become more readily apparent to those of ordinary skill in the art by reference to the following detailed description and accompanying drawings. While it would be desirable to provide a sprinkler that provides one or more of the foregoing or other advantageous features as may be apparent to those reviewing this disclosure, the teachings disclosed herein extend to those embodiments which fall within the scope of patent claims, regardless of whether they accomplish one or more of these advantages or include one or more of these advantageous features.

BRIEF DESCRIPTION OF DRAWINGS

The present system is illustrated by way of example and not limited to the figures of the accompanying drawings in which like references indicate similar elements.

DETAILED DESCRIPTION

Figure 1:
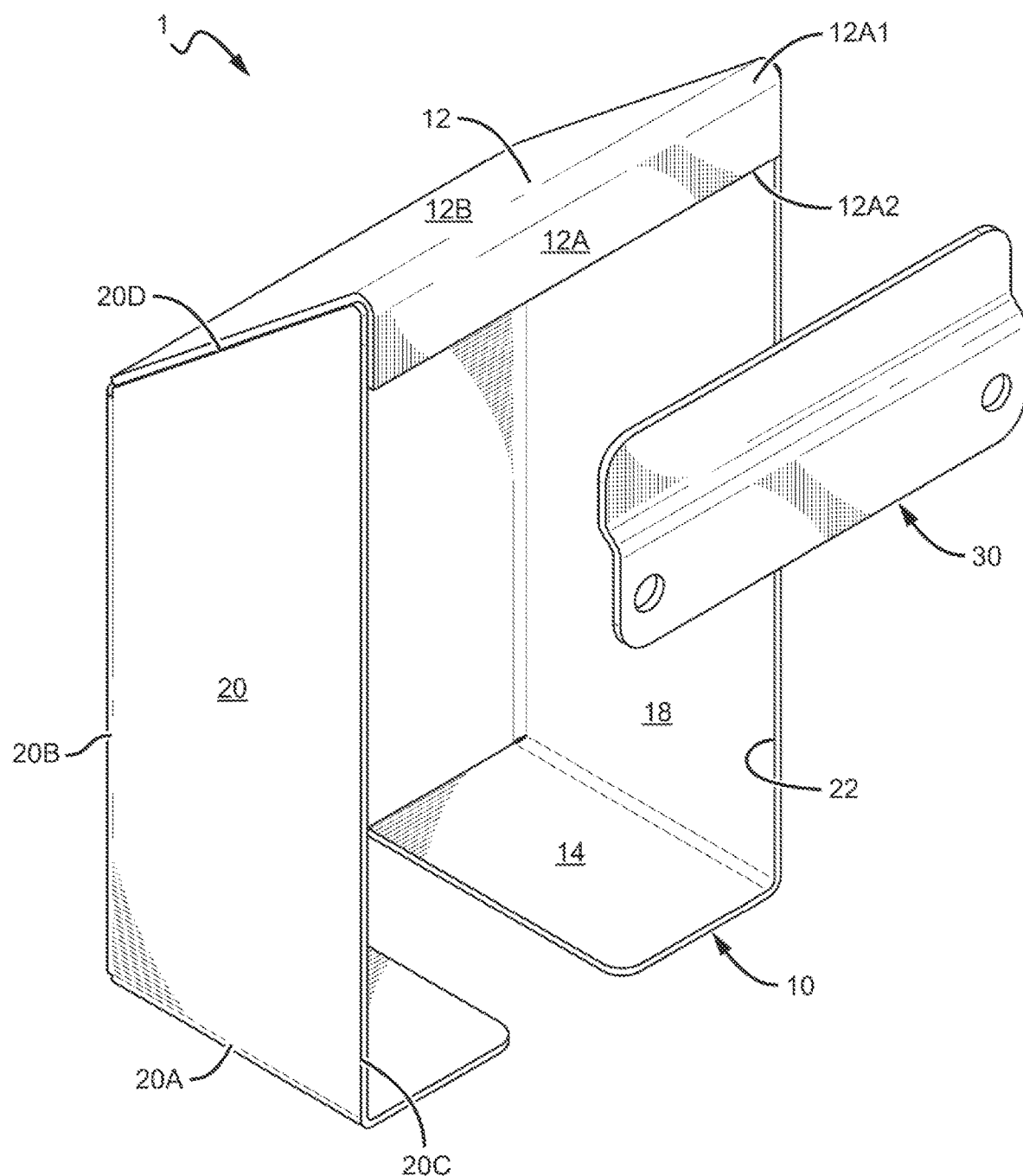
FIG. 1 is an isometric view (from the back) of an electrical outlet cover and bracket, in accordance with an embodiment of the present disclosure.
Figure 2A:
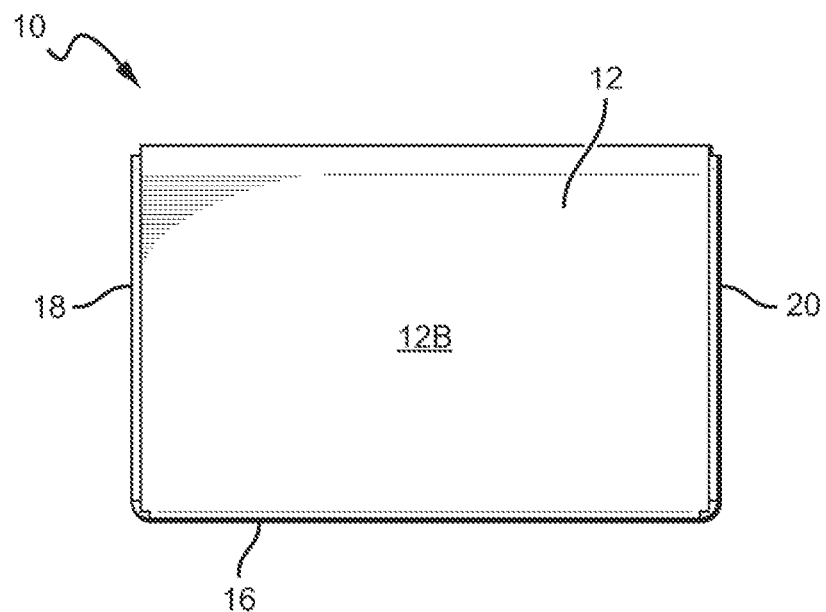
FIGS. 2A, 2B, 2C, 2D, and 2E are a top view, bottom view, front view, left-side view, and right-side view, respectively, of the electrical outlet cover of FIG. 1.
Figure 2B:
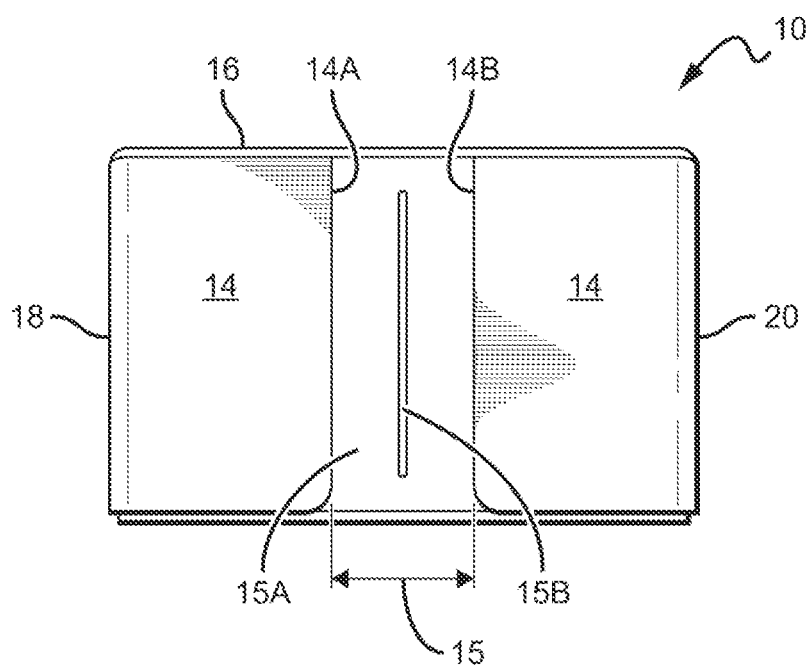
Figure 2D:
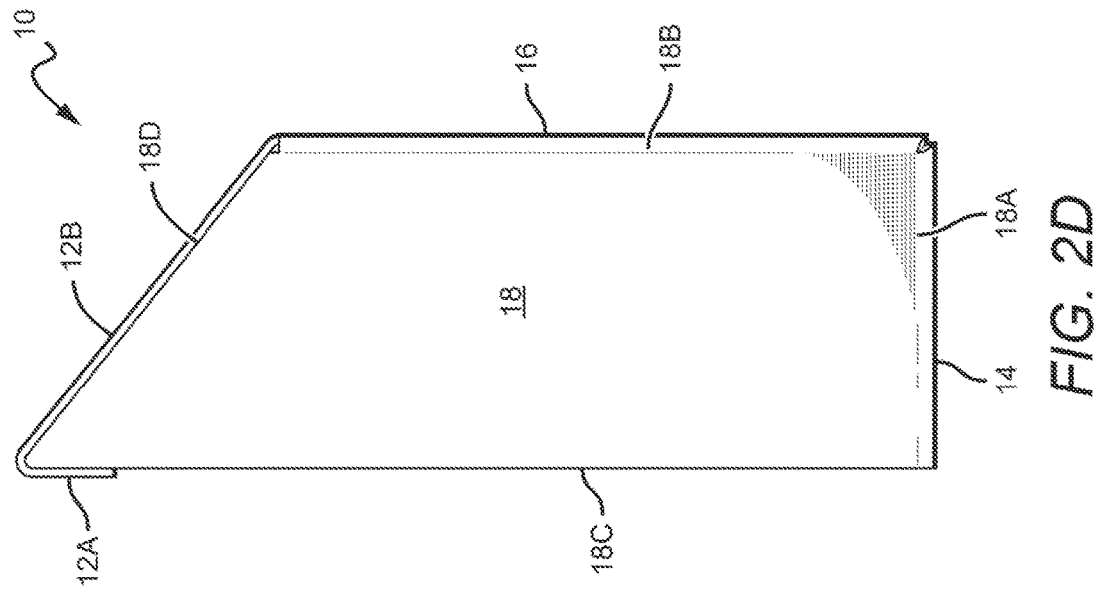
Figure 2C:
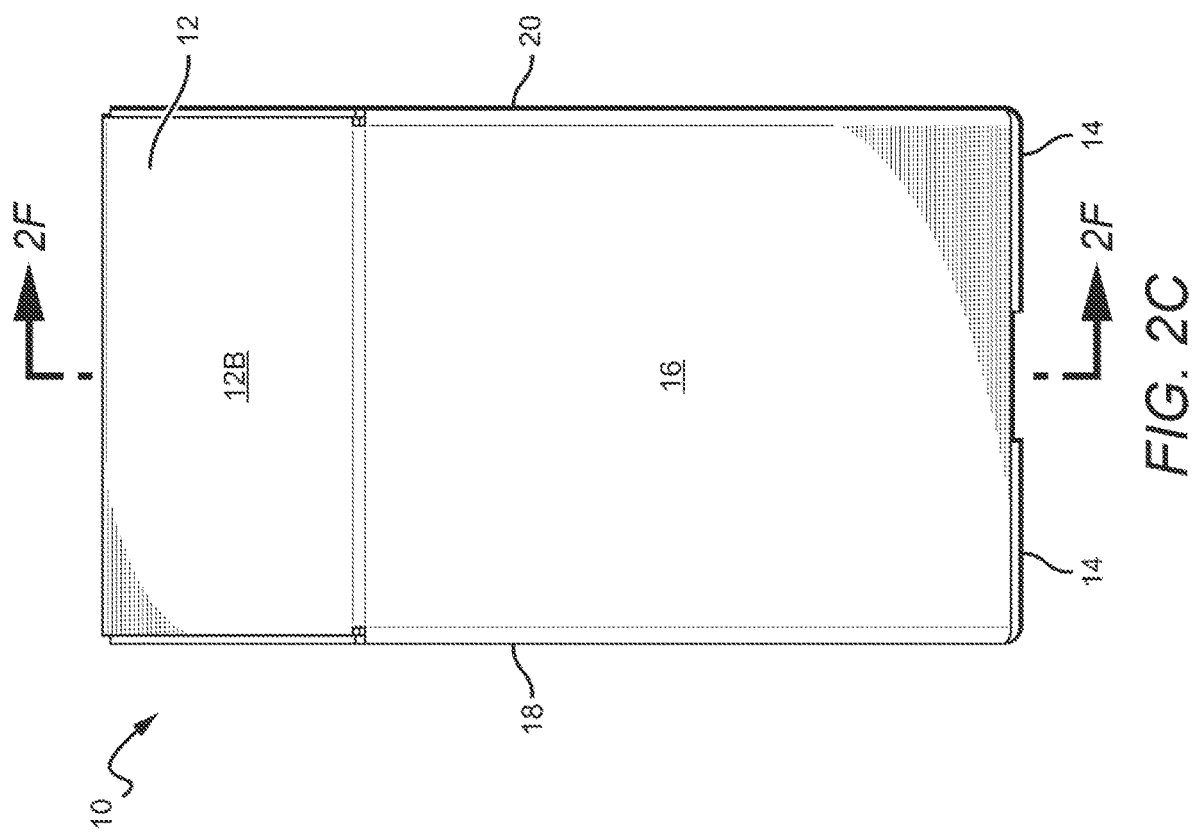
Figure 2E:
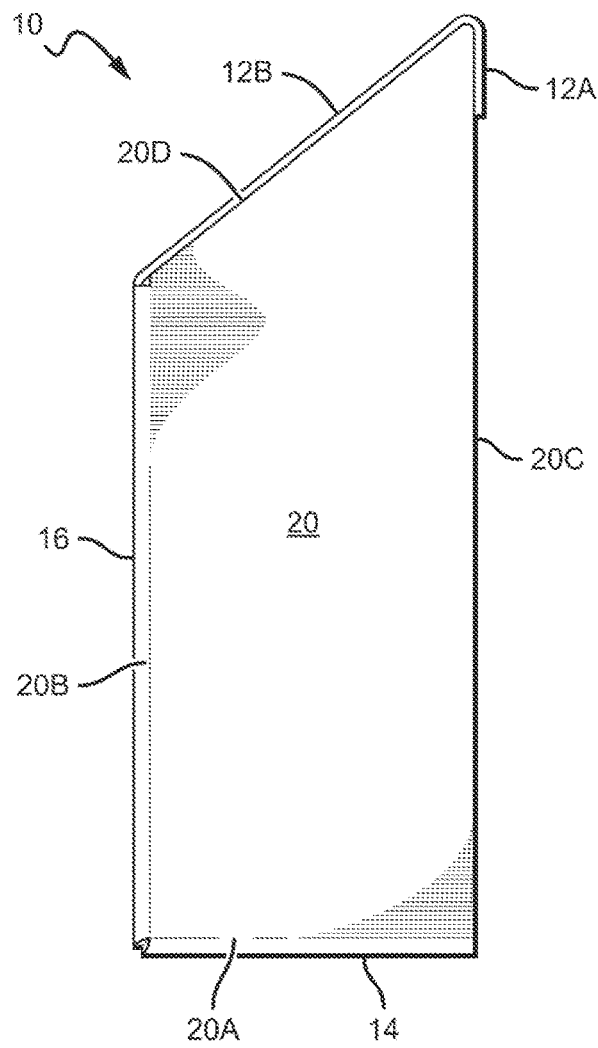
Figure 2F:
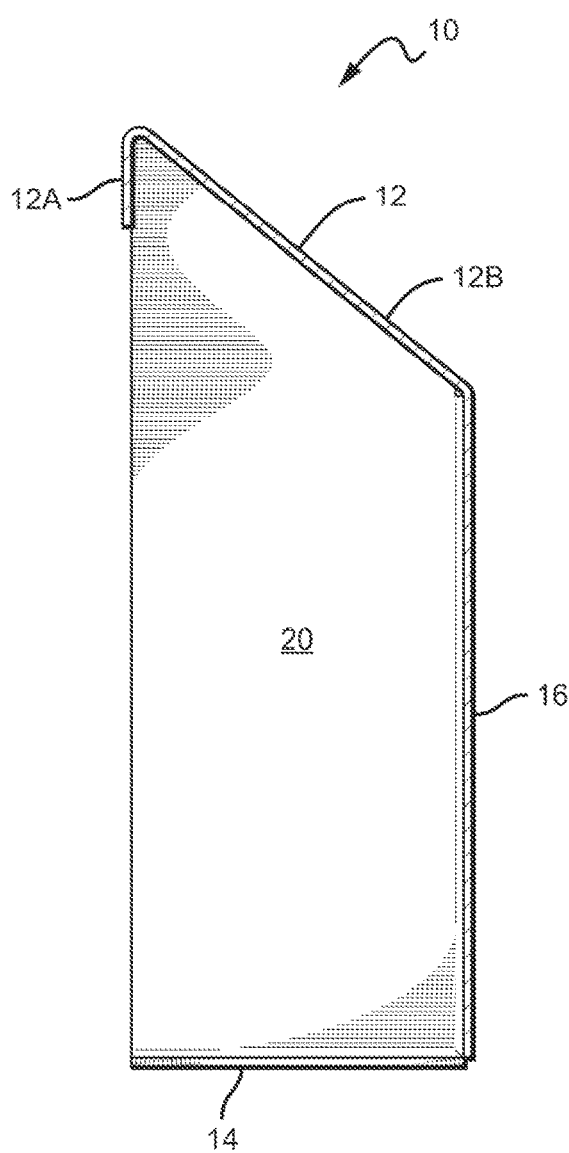
FIG. 2F is an isometric view of the electrical outlet cover taken along line 2F-2F of FIG. 2C.

All identically numbered reference characters correspond to each other so that a duplicative description of each reference character in the drawings may be omitted.

While the present invention may be embodied in many different forms, the illustrative embodiments are described herein with the understanding that the present disclosure is to be considered as providing examples of the principles of the invention and that such examples are not intended to limit the invention to preferred embodiments described herein and/or illustrated herein.

With reference to FIGS. 1 and 2A-2F, an outlet cover 10 is illustrated (outlet cover assembly 1, includes outlet cover 10 and bracket 30), in accordance with an embodiment of the present disclosure, for application to an electrical wall outlet (not illustrated). The outlet cover 10 forms a shape that is designed to surround and provide a protective barrier over the electrical outlet (e.g., one or more receptacles adapted to receive a plug, not shown) in order to keep undesired foreign contaminants and objects (including grease) from entering therein.

The outlet cover 10 includes an upper section 12, bottom section 14, front section 16, left-side section 18, and right-side section 20 opposing the left-side section. These sections may be formed integrally or welded to one another to form the outlet cover 10 and define an aperture or open end 22 (opposite the front section 16) for the outlet cover 10 to accommodate access to the electrical wall outlet. The outlet cover 10 may be constructed from one or more of the following materials: polymer, metal, or stainless steel, including, for example, 16 gauge type 304 stainless steel conforming with ASTM A240.

The upper section 12 comprises lip portion 12A and top portion 12B. The lip portion 12A is positioned generally parallel to the front section 16 and extends downward from (first) end side 12A1 of the lip portion 12A. The open end 22 is defined by a second end side 12A2 (opposite the first end side 12A1) of the lip portion 12A, the bottom section 16, and the side sections 18, 20 of the electrical cover 10. The second end side 12A2 of the lip portion is configured to engage or cooperate with hanging bracket 30, formed separately (described below).

The top portion 12B extends from the first end side 12A1 of the lip portion 12A to a second end side 12B1 on a front side of the electrical cover 10. The left-side section 16 is a mirror image of the right-side section 18. Each side section has a planar shape comprising four sides, namely bottom side 18A (20A), opposing front and back sides 18B (20B) and 18C (20C), and top side 18D (20D). The front side 18B (20B) is attached to the front section 16 of the outlet cover 10. The bottom side 18A (20B) is attached to the bottom section 14 of the electrical cover 10.

The front and back sides 18B, 18C (20B, 20C) extend generally perpendicular and upright from the bottom side 18A (20A). According to one embodiment, the front side 18B (20B) is shorter than the back side 18C (20C) so that the top section 12 of the fully constructed outlet cover 10 slopes downward and away from the open end 22 side of the outlet cover 10. For example, the front side 18B (20B) is 5 inches tall, the back side 18C (20C) is 7 inches tall, and the bottom side 18A (20A) is 2.5 inches long (e.g., depth of the electrical cover 10). One advantage of this novel design is that it reduces or eliminates pooling or collection of any undesired liquid contaminants on the outlet cover 10 and facilitates the removal of such contaminants away from the electrical outlet. Another advantage, compared to flat top surface (e.g., perpendicular to floor), is that it deters or prevents the setting of items on top of the outlet cover 10. The upper section 12 may also comprise grooves or a slick coating surface to further facilitate the removal of any contaminants away from the cover unit 10.

The bottom section 14 comprises bottom left section 14A and bottom right section 14B, forming a gap 15 therebetween. According to one embodiment, the left surface 18 and right surface 20 may be formed 3, 4, 5, or 6 inches apart and the gap 15 is formed in the middle and extends the depth of the outlet cover 10. The gap 15 is configured to allow for the passage of an electrical cord (not shown) inside the outlet cover to be plugged into the electrical outlet, so the diameter of the gap may vary depending on the type of electrical cord being covered. It also allows for the dissipation of heat generated by the electrical plug outside of the cover unit 10. A rubber gasket 15A may be attached to the gap 15 to result in a more watertight fit (from otherwise open section of bottom surface 14) for the outlet cover 10 when attached to the bracket 30. The gasket 15A may include a slit 15B configured to snugly envelope an electrical cord passing therethrough.) The bottom section 14A and/or 14B may be formed integrally with the respective side section 18, 20. In an alternative design, the bottom section 14 can be eliminated from the outlet cover 10.

Exposed edge portions of the upper section 12, including the lip portion 12A, the bottom section 14, the left-side section 18, and the right-side section 20 may be rounded or otherwise designed to reduce or eliminate catch or snag points that may compromise or damage the integrity of an electrical cord passing therethrough.

A handle (not shown) may be attached to one or more of the surfaces of the outlet cover 10 to facilitate attachment of peripheral kitchen devices.

Figure 3:
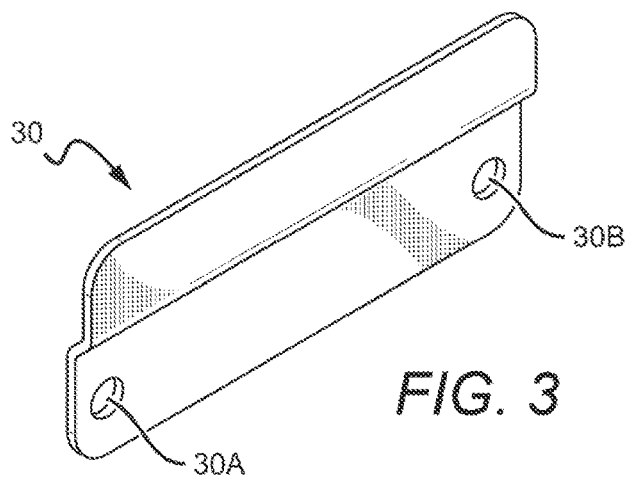
FIG. 3 is an isometric view of a hanging bracket, in accordance with an embodiment of the present disclosure.

Referring to FIG. 3, the hanging bracket 30 is illustrated, in accordance with an embodiment of the present disclosure, for application of the outlet cover 10 to an electrical wall outlet (not illustrated). The hanging bracket is designed to be attached or fixed to a mounting surface (e.g., wall) adjacent to the electrical outlet desired to be covered. According to the embodiment shown in FIG. 3, for example, the hanging bracket 30 includes a screw hole 30A, 30B formed on opposing sides in the lengthwise direction of the bracket 30. The screw holes 30A, 30B allow for the passage of a screw therethrough to allow the bracket 30 to be attached to the wall, e.g., #10×¾ Self tapping 18/8 Stainless Steel sheet metal screws.

More or less screw holes 30A, 30B, and other known methods of securely attaching the bracket 30 to the wall may be used, e.g., nail, bolt, adhesive, Velcro, etc. The length of the bracket 30 may be less than the length of the lip portion 12A, e.g., to enable the outlet cover 10 to be flush, or near flush, with the wall thereby reducing opportunities for contaminants from reaching inside the outlet cover 10. According to one embodiment, lip portion 12A is 4 inches long and bracket 30 is 3.5 inches long. The hanging bracket 30 is designed with an offset portion across the lengthwise direction to accommodate the receipt of the lip portion 12A to thereby allow the outlet cover 10 to securely and removably attach to the bracket 30, preferably in a watertight manner (e.g., liquid or airborne contaminants, such as water or grease, can only enter the inside of the outlet cover 10 via the gap 15, and this entry can be minimized or eliminated with application of the gasket 15A. According to one embodiment, the offset is ⅛ inch offset; however, other dimensions could be used depending on the dimensions of the outlet cover 10.

One method of installing the cover unit assembly 1 is described below; however, some steps may be omitted without departing from the method. First, operator should turn OFF the power to the electrical outlet being covered at the main circuit breaker (not shown). Second, the operator should test the receptacle to confirm that the power is OFF. Third, leaving the existing 50-amp equipment (example) plug plugged-in, set the cover unit 10 over top of the 50-amp plug pushing tightly against the wall (e.g., make sure that it is level and leave approximately ¼ inch space between the top of the 50-amp plug and the inside of the top surface 12 of the cover unit 10). Fourth, draw a straight and level line across the top of the cover unit 10 on the wall. Fifth, remove the cover unit 10 and prepare to install the hanging bracket 30 on the wall. Sixth, cover the line drawn on the wall with the hanging bracket 30 and attach to the wall with fixing element, e.g., the (2) #10×¾ self-tapping sheet metal screws. Seventh, set the cover unit 10 on the top lip of the hanging bracket 30 and push down for a snug fit, e.g., ¼ of an inch. Next, turn the power ON at the main circuit breaker since installation is complete.

While illustrative embodiments of the invention have been described herein, the present invention is not limited to the various preferred embodiments described herein, but includes embodiments having equivalent elements, modifications, omissions, combinations (e.g., of aspects across various embodiments), adaptations and/or alterations as would be appreciated by those in the art based on the present disclosure.

The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure.

The language present invention or invention should not be improperly interpreted as an identification of criticality, should not be improperly interpreted as applying across all aspects or embodiments (it is understood that the present invention has a number of aspects and embodiments), and should not be improperly interpreted as limiting the scope of the application or claims.

In this disclosure and during the prosecution of this application, the terminology "embodiment" can be used to describe any aspect, feature, process or step, any combination thereof, and/or any portion thereof, etc. In some examples, various embodiments may include overlapping features. In this disclosure, the following abbreviated terminology may be employed: "e.g." which means "for example."

I claim:

1. An outlet cover, comprising:
   upper section comprising a lip portion and a top portion;
   a front section attached to the top portion of the upper section;
   a right-side section attached to the front section and the upper section;
   a left-side section attached to the front section and the upper section;
   a bottom section attached to the front section, the right-side section, and the left-side section; and
   a rubber gasket having a slit formed therein, wherein
   the lip portion extends downward and is positioned generally parallel to the front section,
   the right-side section is planar shaped comprising right-side bottom side, right-side front side, right-side back side, and right-side top side,
   the left-side section is planar shaped comprising left-side bottom side, left-side front side, left-side back side, and left-side top side,
   an open end opposite the front section is defined by the lip portion, the right-side back side and the left-side back side,
   the top portion of the upper section slants downward and away from the open end of the outlet cover and towards the front section of said outlet cover,
   the open end is further defined by the bottom section,
   an opening is formed in the bottom section, the opening extends the depth of said outlet cover and is configured to allow passage of an electrical cord inside said outlet cover,
   the rubber gasket configured to fill in an entire space provided by the opening, and
   the rubber gasket is configured to provide a generally watertight fit and allow passage of the electrical cord through the slit and inside said outlet cover.

2. The outlet cover of claim 1, further comprising:
   a bottom section attached to the front section, the right-side section, and the left-side section, wherein
   the bottom section comprises bottom left section and bottom right section, the bottom left-section attached to the front section and the left-side section, and the bottom right-section attached to the front section and the right-side section,
   the bottom left section is separated from the bottom right section forming the opening, the opening configured to allow passage of an electrical cord inside said outlet cover, and
   the open end of said outlet cover is further defined by the bottom left section and the bottom right section.

3. The outlet cover of claim 2, wherein the opening is formed in a middle of the bottom section.

4. The outlet cover of claim 3, wherein the opening is 3-5 inches wide and portions of the bottom left section and the bottom right section defining the opening are rounded to reduce catch or snag points.

5. The outlet cover of claim 1, further comprising:
   a groove formed in the top portion of the upper section, wherein
   the groove extends in a lengthwise direction to facilitate removal of any liquid contaminants away from the outlet cover.

6. The outlet cover of claim 1, wherein:
   the right-side section is the same size as the let-side section,
   the left-side front side and left-side back side extend perpendicular from the left-side bottom side, and the left-side front side is shorter than the left-side back side,
   the right-side front side and right-side back side extend perpendicular from the right-side bottom side, and the right-side front side is shorter than the right-side back side.

7. The outlet cover of claim 6, wherein:
   the left-side front side and right-side front side are 5 inches tall, the left-side back side and right-side back side are 7 inches tall, and the left-side bottom-side and right-side bottom side are 2.5 inches long.

8. The outlet cover of claim 1, wherein the upper section is formed integrally with the front section, right-side section and left-side section.

9. The outlet cover of claim 1, wherein the upper section comprises a slick coating outer surface to facilitate removal of contaminants away from said outlet cover.

10. An outlet cover, comprising:
an upper section comprising a lip portion, a top portion, and a groove formed in the top portion;
a front section attached to the top portion of the upper section;
a right-side section attached to the front section and the upper section; and
a left-side section attached to the front section and the upper section, wherein
the lip portion extends downward and is positioned generally parallel to the front section,
the right-side section is planar shaped comprising right-side bottom side, right-side front side, right-side back side, and right-side top side,
the left-side section is planar shaped comprising left-side bottom side, left-side front side, left-side back side, and left-side top side,
an open end opposite the front section is defined by the lip portion, the right-side back side and the left-side back side, and
the top portion of the upper section slants downward and away from the open end of the outlet cover and towards the front section of said outlet cover, and
the groove extends in a lengthwise direction to facilitate removal of any liquid contaminants away from the outlet cover.

11. The outlet cover according to claim 10, further comprising:
a bottom section attached to the front section, the right-side section, and the left-side section; and
an opening formed in the bottom section, wherein
the opening is configured to allow passage of an electrical cord inside said outlet cover.

12. The outlet cover according to claim 11, further comprising:
a rubber gasket having a slit formed therein, wherein
the rubber gasket configured to fill in the space provided by the opening, and
the rubber gasket is configured to provide a generally watertight fit and allow passage of the electrical cord through the slit and inside said outlet cover.

13. The outlet cover according to claim 10, further comprising
a bottom section attached to the front section, the right-side section, and the left-side section, wherein
the bottom section comprises bottom left section and bottom right section, the bottom left-section attached to the front section and the left-side section, and the bottom right-section attached to the front section and the right-side section,
the bottom left section is separated from the bottom right section forming a gap therebetween, the gap configured to allow passage of an electrical cord inside said outlet cover, and
the open end of said outlet cover is further defined by the bottom left section and the bottom right section.

14. The outlet cover of claim 13, wherein the gap is formed in a middle of the bottom section and extends an entire depth of said outlet cover.

15. The outlet cover of claim 13, wherein the gap is 2-4 inches wide and portions of the bottom left section and the bottom right section defining the gap are rounded to reduce catch or snag points.

16. The outlet cover of claim 10, wherein:
the right-side section is the same size as the let-side section,
the left-side front side and left-side back side extend perpendicular from the left-side bottom side, and the left-side front side is shorter than the left-side back side,
the right-side front side and right-side back side extend perpendicular from the right-side bottom side, and the right-side front side is shorter than the right-side back side.

17. The outlet cover of claim 16, wherein:
the left-side front side and right-side front side are 5 inches tall,
the left-side back side and right-side back side are 7 inches tall, and
the left-side bottom-side and right-side bottom side are 2.5 inches long.

18. The outlet cover of claim 10, wherein the upper section is formed integrally with the front section, right-side section and left-side section.

19. The outlet cover of claim 10, wherein the upper section comprises a slick coating outer surface to facilitate removal of contaminants away from said outlet cover.

* * * * *